(12) United States Patent
Wu et al.

(10) Patent No.: US 8,618,556 B2
(45) Date of Patent: Dec. 31, 2013

(54) FINFET DESIGN AND METHOD OF FABRICATING SAME

(75) Inventors: Cheng-Hsien Wu, Taipei (TW); Chih-Hsin Ko, Fongshan (TW); Yao-Tsung Huang, Kaohsiung (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 179 days.

(21) Appl. No.: 13/174,170

(22) Filed: Jun. 30, 2011

(65) Prior Publication Data

US 2013/0001591 A1 Jan. 3, 2013

(51) Int. Cl.
*H01L 29/24* (2006.01)
*H01L 29/26* (2006.01)

(52) U.S. Cl.
USPC 257/77; 257/76; 257/E29.255; 257/E29.081; 257/E21.409; 438/197

(58) Field of Classification Search
USPC .............. 257/77, 76, 192, E29.255, E29.081, 257/E29.1, E29.104, E21.409; 438/197
See application file for complete search history.

(56) References Cited

U.S. PATENT DOCUMENTS

2006/0113605 A1* 6/2006 Currie ........................... 257/368

* cited by examiner

*Primary Examiner* — Whitney T Moore
(74) *Attorney, Agent, or Firm* — Haynes and Boone, LLP

(57) ABSTRACT

An integrated circuit device and method for manufacturing the same are disclosed. An exemplary device includes a semiconductor substrate having a substrate surface and a trench isolation structure disposed in the semiconductor substrate for isolating an NMOS region of the device and from a PMOS region of the device. The device further includes a first fin structure comprising silicon or SiGe disposed over a layer of III-V semiconductor material having a high band gap energy and a lattice constant greater than that of Ge; a second fin structure comprising silicon or SiGe disposed over a layer of III-V semiconductor material having a high band gap energy and a lattice constant smaller than that of Ge; and a gate structure disposed over and arranged perpendicular to the first and second fin structures.

18 Claims, 8 Drawing Sheets

US 8,618,556 B2

FINFET DESIGN AND METHOD OF FABRICATING SAME

BACKGROUND

As the semiconductor industry has progressed into nanometer technology process nodes in pursuit of higher device density, higher performance, and lower costs, challenges in both fabrication and design have resulted in the development of three dimensional designs, including a fin-like field effect transistor commonly referred to as a "FinFET". A typical FinFET is fabricated on a silicon substrate on which silicon is etched into a vertical fin-shaped body extending from the substrate. The channel of the FET is comprised of the vertical fin. The gate is wrapped around and over the fin, providing for a double gate structure that enables gate control of the channel from both sides. Additionally, FinFETs enjoy a reduction in the short channel effect, as well as higher current flow.

In prior art FinFET designs, silicon is used as the channel material, with silicon germanium ("SiGe") being used as a source/drain ("S/D") stressor. Unfortunately, silicon has a low electron and hole mobility, making it a less than ideal choice for the channel. Additionally, strain-enhanced performance will become saturated with increasing strain; as a result, there are limits to S/D strain-enhancement.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
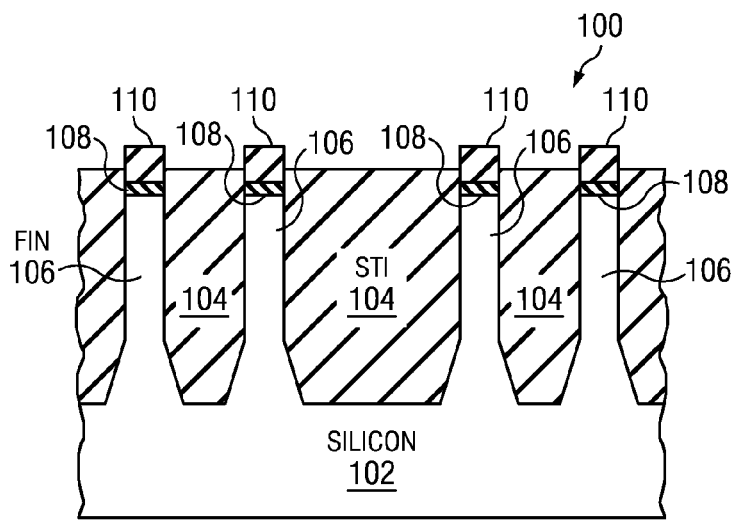
FIGS. 1-6, 7A, 7B, 8-14, 15A, and 15B illustrate an integrated circuit device in accordance with one embodiment at various stages of fabrication.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIGS. 1-6, 7A, 7B, 8-14, 15A, and 15B provide various views of an integrated circuit device 100, in portion or entirety, at various stages of fabrication. The integrated circuit device 100 may be an integrated circuit chip, system on chip ("SoC"), or portion thereof, that includes various passive and active microelectronic devices such as resistors, capacitors, inductors, diodes, metal-oxide semiconductor field effect transistors ("MOSFETs"), complementary metal-oxide semiconductor ("CMOS") transistors, high voltage transistors, high frequency transistors, other suitable components, or combinations thereof. In the depicted embodiment, the integrated circuit device 100 includes a field-effect transistor ("FET") device. More specifically, the depicted embodiment comprises a CMOS FinFET device. The Figures have been simplified for the sake of clarity to better convey the inventive concepts of the present disclosure. Additional features may be included in the integrated circuit device 100, and some of the features described below may be replaced or eliminated in other embodiments of the integrated circuit device.

Figure 2:
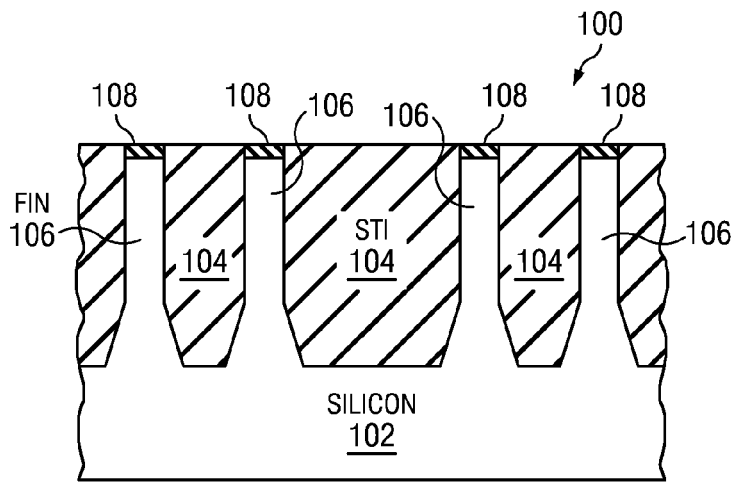

FIG. 1 illustrates the integrated circuit device 100 in accordance with one embodiment. The integrated circuit device 100 includes a substrate 102, which in the illustrated embodiment comprises silicon ("Si"), having a plurality of trenches 104, one or more of which may be for shallow trench isolation ("STI") purposes, disposed therein to form silicon fins 106 therebetween. A dielectric material, such as silicon dioxide ("$SiO_2$") is disposed in the trenches 104. A silicon oxide ("SiO") layer 108 and a silicon nitride ("SiN") hard mask layer 110 are disposed on each of the fins 106 in a conventional fashion. In one embodiment, the dielectric disposed within the dielectric-filled trenches 104 has been recessed, e.g., using a dry etching process, between the fins 106, as illustrated in FIG. 1. In FIG. 2, subsequent to the etching of the dielectric, the SiN hard mask layer 110 is removed using a wet or dry etching process and a chemical-mechanical polish ("CMP") process may be performed to planarize the surface of the device 100.

Figure 3:
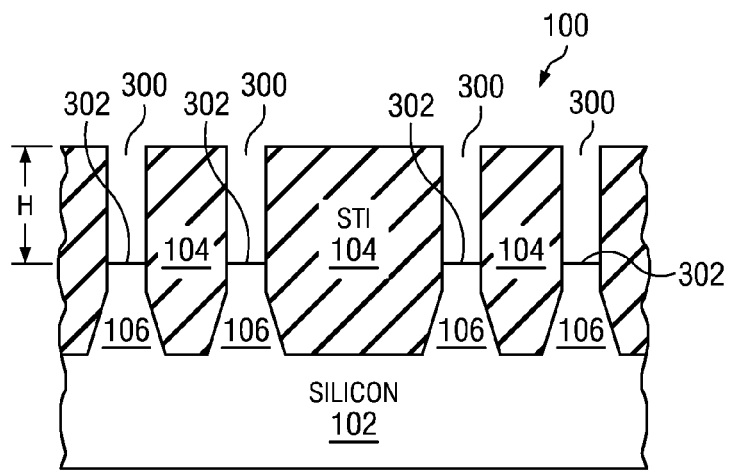

FIG. 3 illustrates the device 100 after the SiO layer 108 has been removed and the silicon comprising the fins 106 has been subsequently recessed to form secondary trenches 300. The formation of the trenches 300 may be accomplished using a combination of dry and wet etching processes or simply using a wet etching process. In one embodiment, for silicon having a (100) surface orientation, a bottom surface 302 of each of the secondary trenches 300 will be flat, as illustrated in FIG. 3, while for silicon having a (111) surface orientation, the bottom surface of each of the secondary trenches will be V-shaped. A height H of each of the trenches 300 may be within the range of approximately 60-150 nm.

Figure 4:
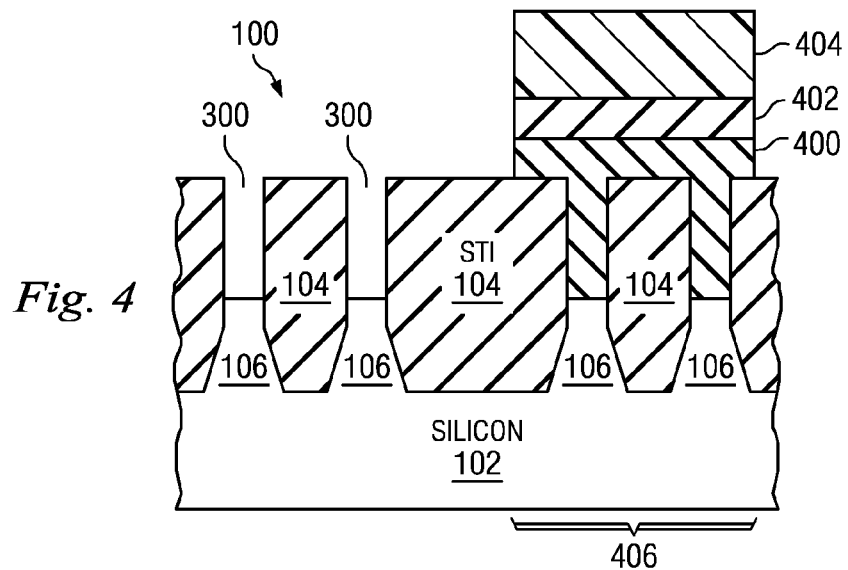
Figure 5:
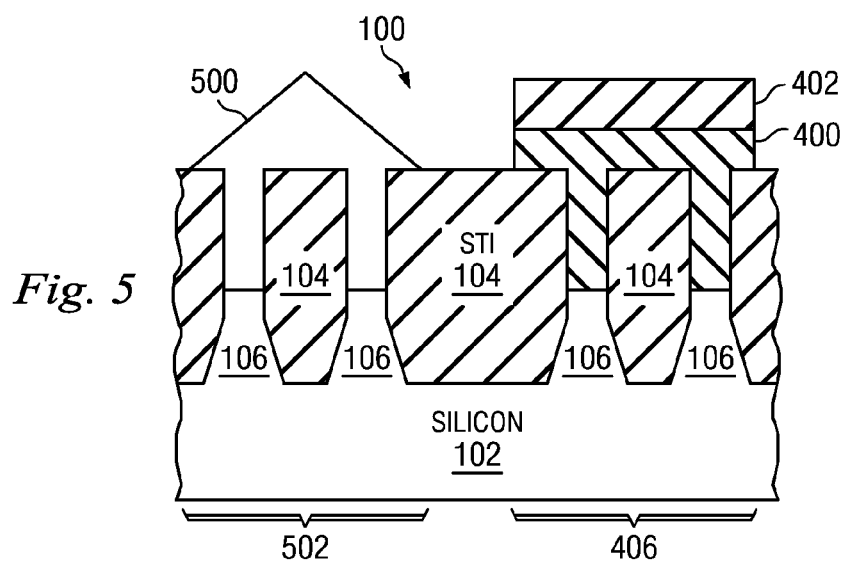
Figure 6:
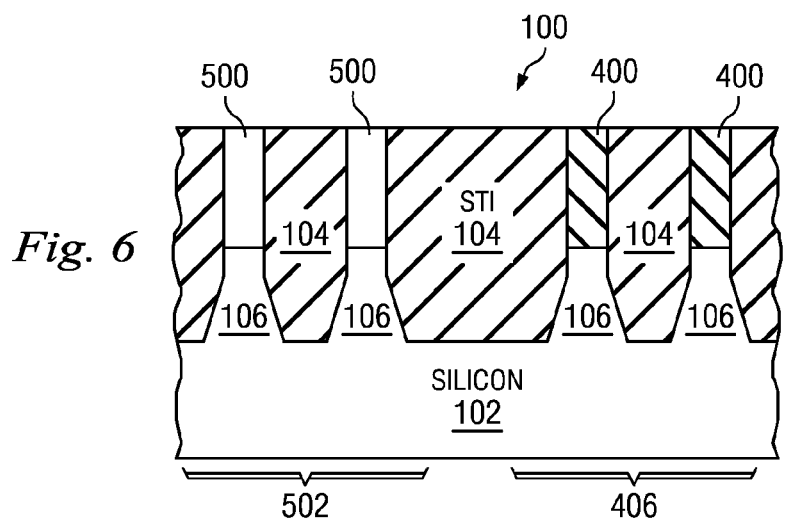

FIG. 4 illustrates the device 100 after multiple layers comprising an oxide or nitride layer 400, a hard mask layer 402, and a photoresist layer 404, have been formed over the trenches 104, 106, on a PMOS side 406 of the device 100. As shown in FIG. 5, after the layers 400, 402, 404, have been formed and patterned and the layer 404 has been subsequently removed using an appropriate process or processes, a layer 500 of III-V material is grown on an NMOS side 502 of the device 100. In one embodiment, the layer 500 may be grown using a chemical vapor deposition ("CVD") epitaxy process performed at a growth temperature within the range of approximately 200-1200 degrees Celsius. In accordance with features of embodiments described herein, the layer 500 comprises one of indium phosphide ("InP"), aluminum indium arsenide ("AlInAs"), indium gallium phosphide ("InGaP"), indium gallium arsenide ("InGaAs"), gallium arsenide antimonide ("GaAsSb"), or any other III-V semiconductor material having a high band gap energy and a lattice constant larger than that of germanium ("Ge"), thereby to provide channel tensile strain to enhance electron mobility. FIG. 6 illustrates the device 100 after a CMP process has been performed to planarize the surface thereof.

Figure 7A:
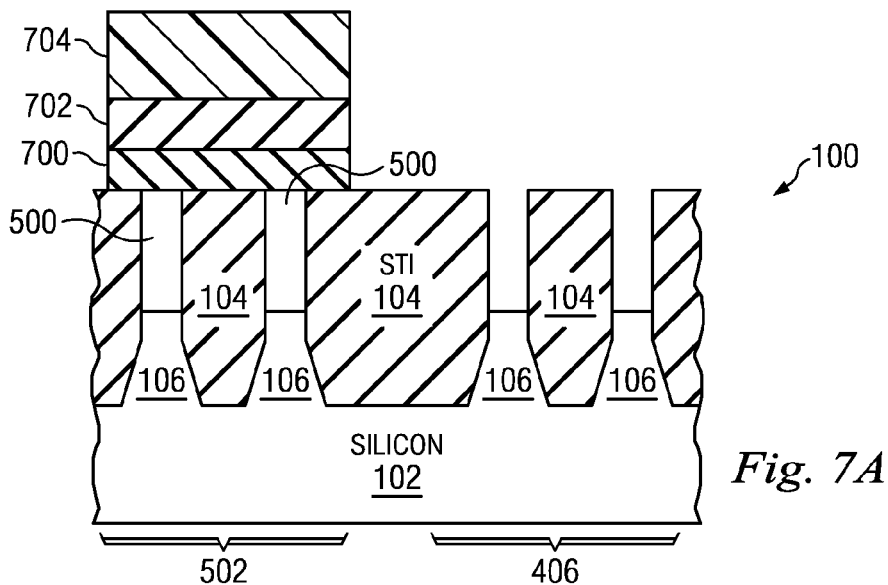
Figure 7B:
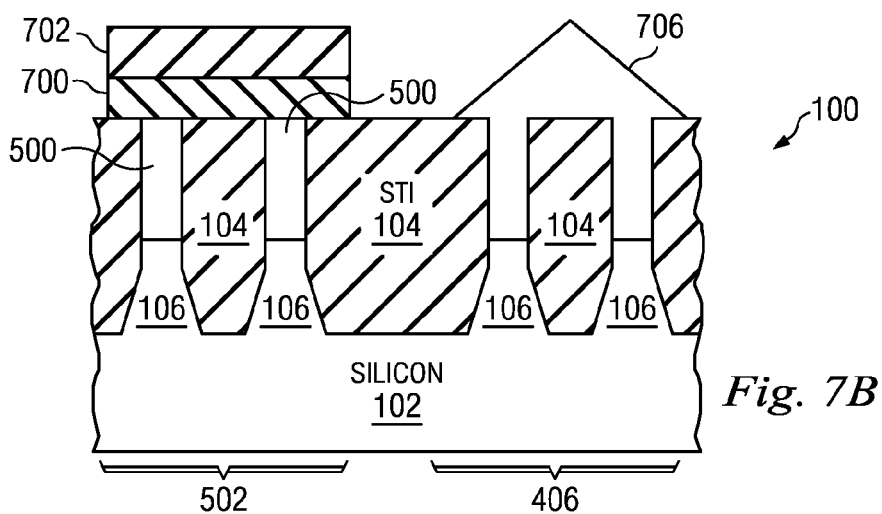
Figure 8:
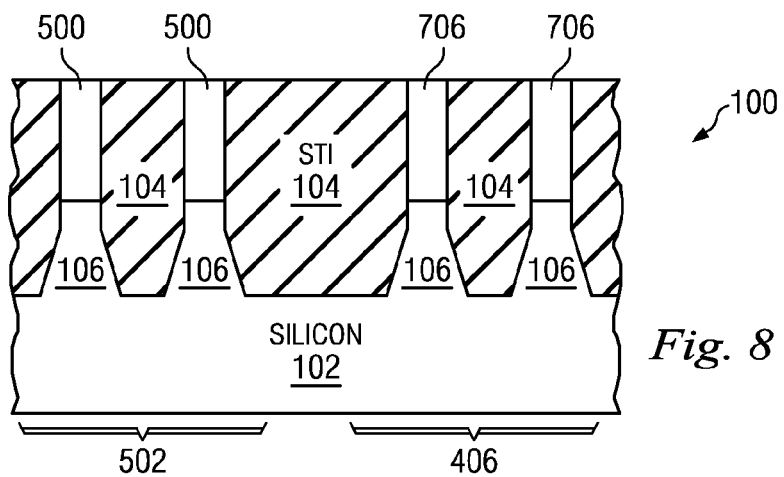

FIG. 7A illustrates the device 100 after the oxide/nitride layer 400 has been removed using an appropriate process or processes and multiple layers comprising an oxide or nitride layer 700, a hard mask layer 702, and a photoresist layer 704, have been formed over trenches on the NMOS side 502 of the device 100. After the layers 700, 702, 704, have been formed and patterned and the layer 704 has been subsequently removed using an appropriate process or processes, a layer 706 of III-V semiconductor material is grown on the PMOS side 406 of the device 100, as shown in FIG. 7B. In accordance with features of embodiments described herein, the layer 706 comprises one of SiGe, gallium phosphide nitride ("GaPN"), aluminum phosphide nitride ("AlPN"), silicon carbide ("SiC"), or any other III-V semiconductor material having a high band gap energy and a lattice constant equal to or smaller than that of Ge, thereby to provide channel compressive strain to enhance hole mobility. FIG. 8 illustrates the device 100 after a CMP process has been performed to planarize the surface thereof.

Figure 9:
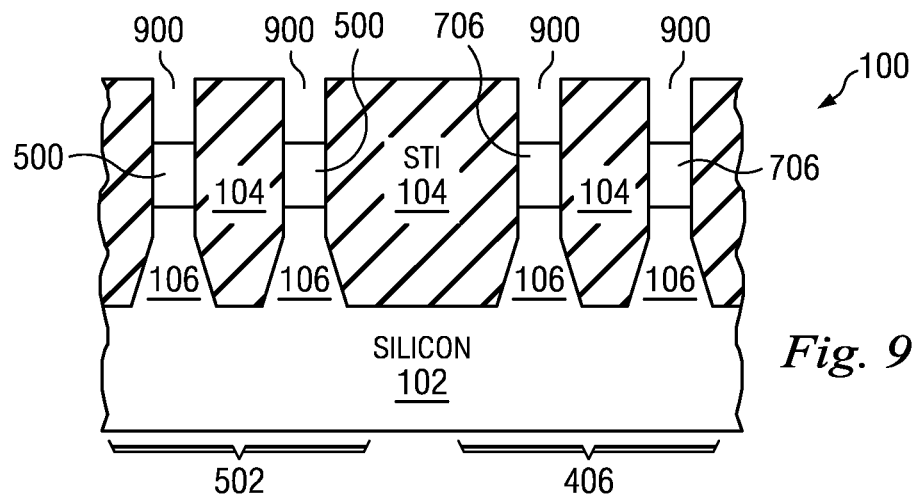
Figure 10:
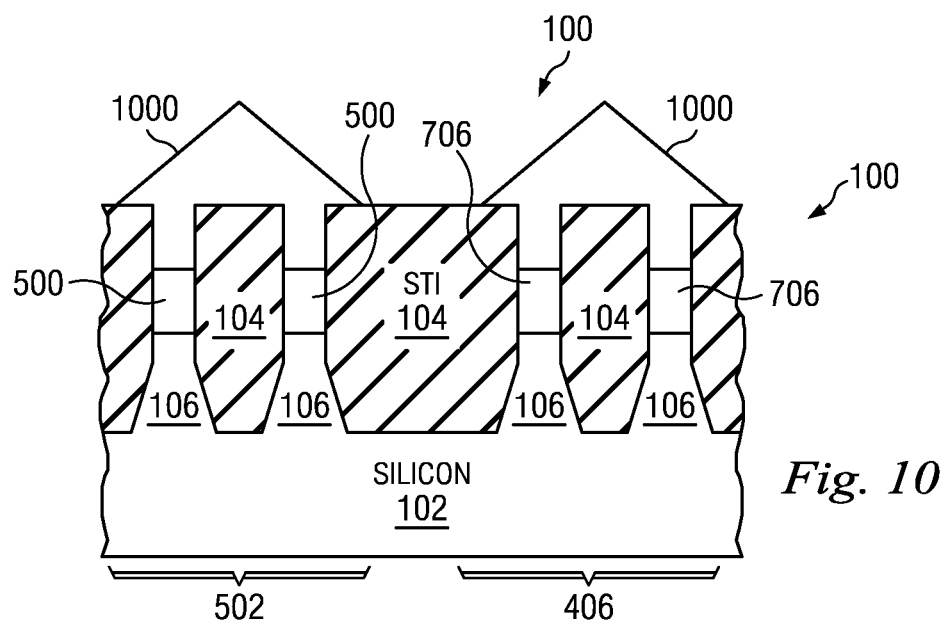
Figure 11:
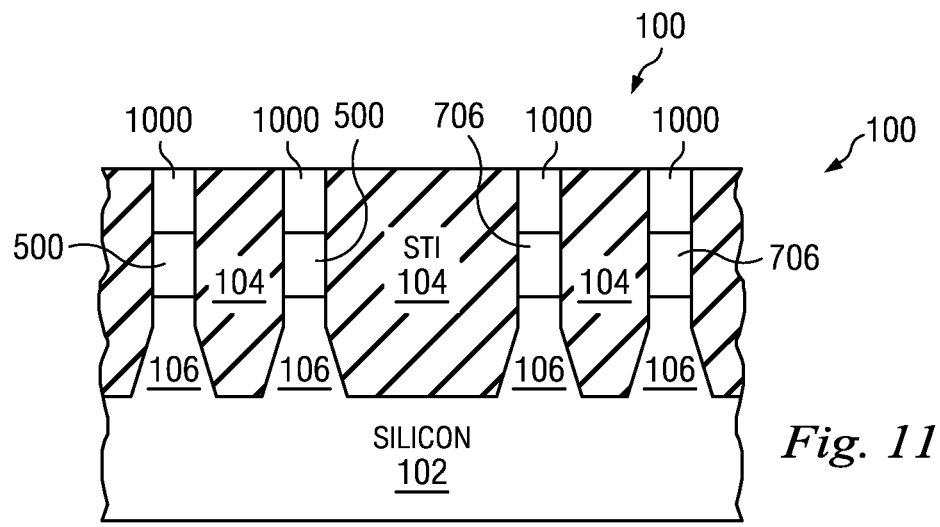

FIG. 9 illustrates the device 100 after the approximately 50% of each of the layers 500 and 706 disposed in the trenches 300 (FIG. 3) have been recessed using a dry or wet etching process to create reduced trenches 900. It will be recognized that the same chemical(s) could be used to perform the etching process on both the PMOS and NMOS sides 406, 502, or that the sides could be etched independently using different chemicals. In one embodiment, the depth of the reduced trenches 900, is within the range of approximately 25-75 nm; moreover, the depth of the trenches on the PMOS side 406 may be different than that of those on the NMOS side 502. In FIG. 10, a layer 1000, which may comprise Si, Ge, SiGe or $Si_{1-x}Ge_x$ (x=0-1), for example, is grown over the trenches 900 on both the PMOS side 406 and the NMOS side 502. Once again, this growth may be accomplished using a conventional CVD epitaxy process. As shown in FIG. 11, subsequent to the growth of the layer 1000, a CMP process is performed to planarize the surface of the device 100.

Figure 12:
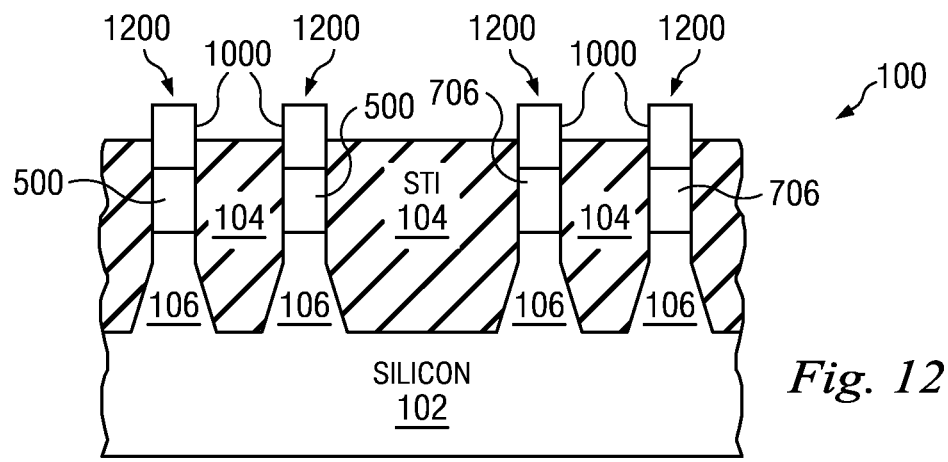
Figure 13:
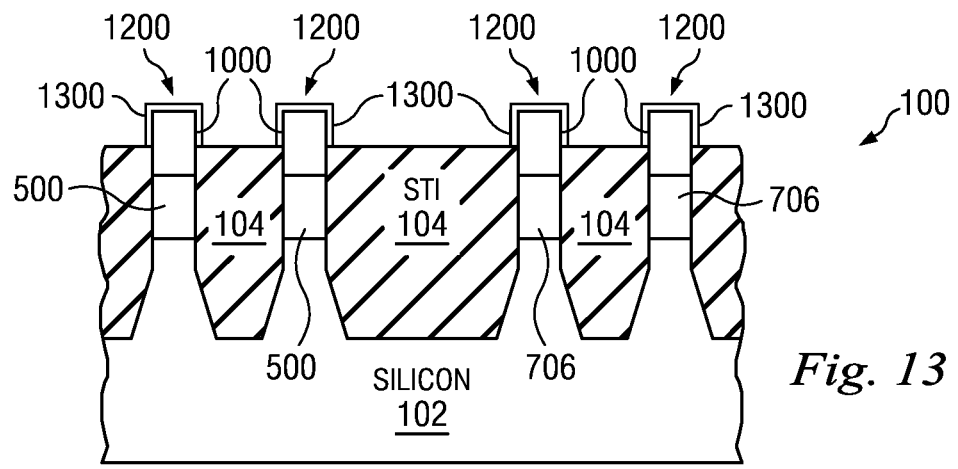
Figure 14:
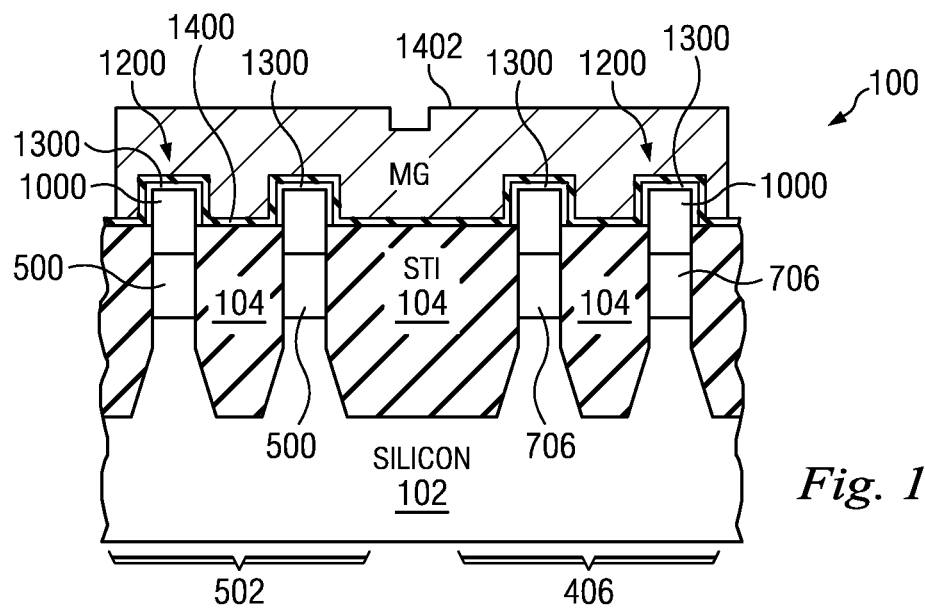

FIG. 12 illustrates the device 100 after the dielectric material disposed in the trenches 104 has been recessed, leaving a plurality of Si, Ge, SiGe or $Si_{1-x}Ge_x$ (x=0-1), fins 1200, each having a height within the range of approximately 10-60 nm. FIG. 13 illustrates an optional step of capping the fins 1200 with a layer 1300 comprising InP or InGaP, which layer may be grown using a CVD epitaxy process. In one embodiment, a thickness of the layer 1300 is within the range of 2 Å-2 nm. As illustrated in FIG. 14, a high-K dielectric layer 1400 is deposited over the surface of the device 100, after which a metal gate layer 1402 is formed. The same material may be used to create the layers 1400 and 1402 for both the PMOS side 406 and the NMOS side 502 or different materials may be used.

Figure 15B:
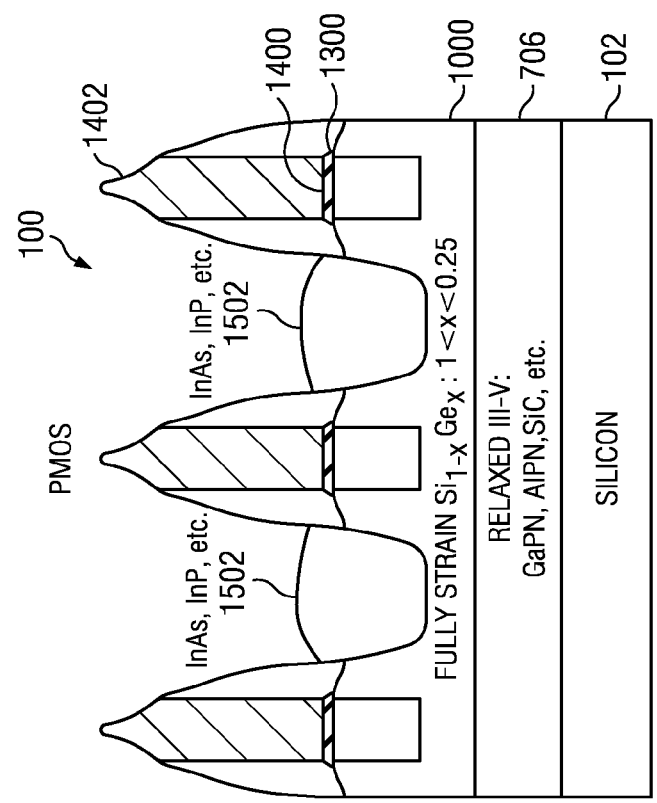
Figure 15A:
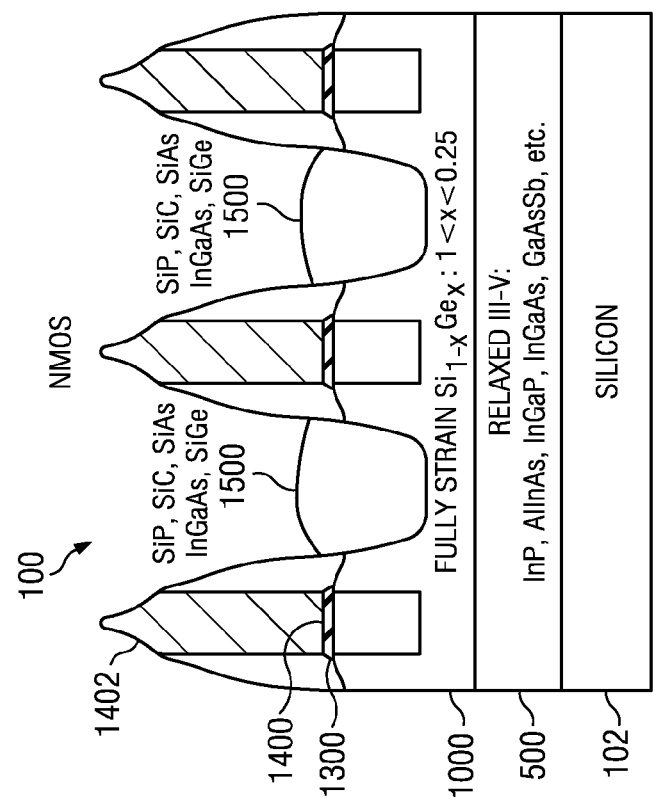

FIGS. 15A and 15B illustrate sectional views of the device 100 along the NMOS side 502 channel (FIG. 15A) and along the PMOS side 406 channel (FIG. 15B). The views illustrated in FIGS. 15A and 15B show the device 100 after source and drain recesses have been created (e.g., via an etching process); the NMOS side S/D region has been covered while the PMOS side is grown; and the PMOS side S/D region has been covered while the NMOS side is grown. In accordance with features of embodiments described herein, the NMOS source/drain ("S/D") regions 1500 comprise a III-V semiconductor material having a small lattice constant (such as silicon phosphide ("SiP"), SiC, silicon material having a large lattice constant (such as indium arsenide ("InAs") or InP) to provide compressive strain to enhance hole mobility.

Figure 16:
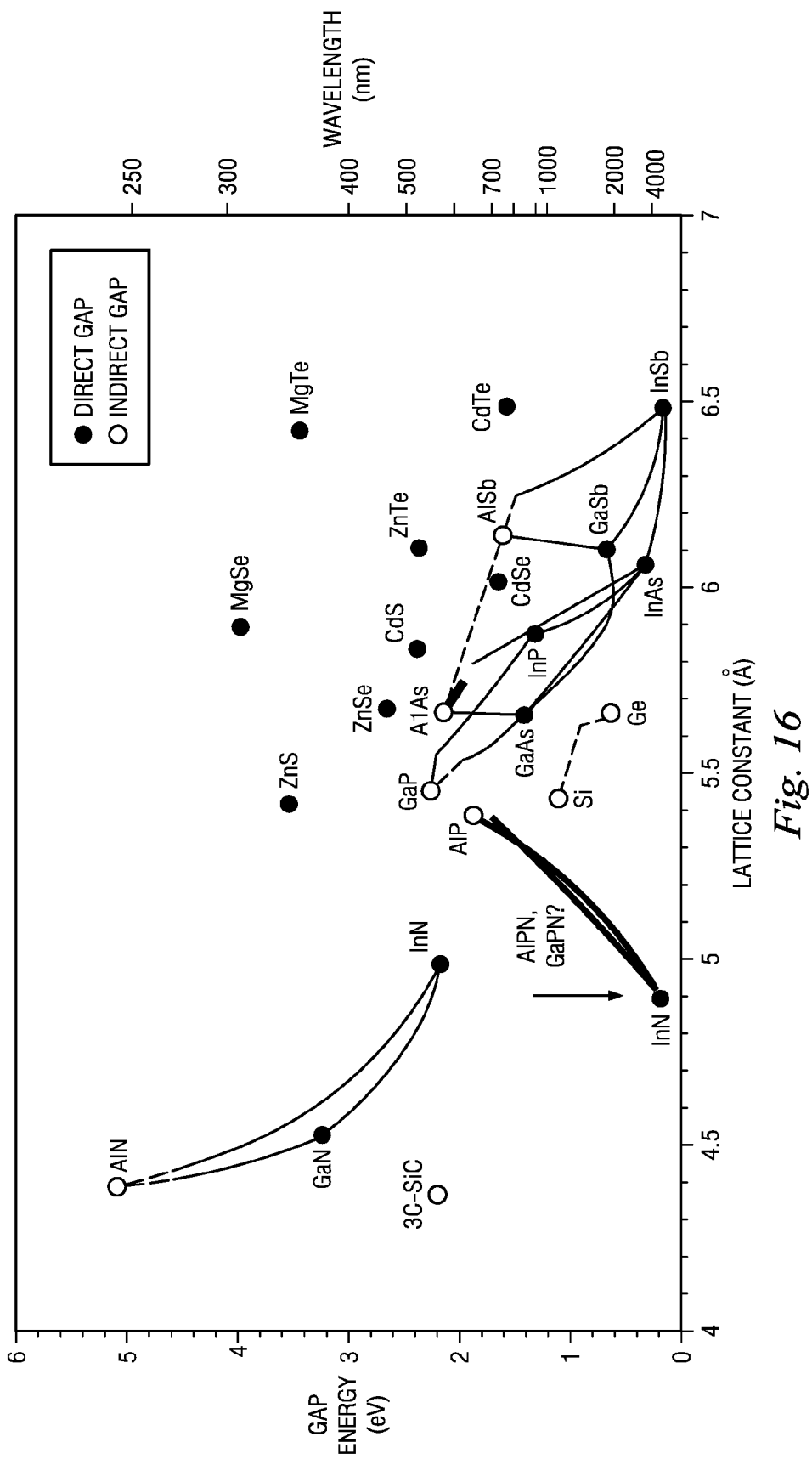
FIGS. 16 and 17 graphs illustrating bandgap vs. lattice constant values for various III-V semiconductor materials that may be employed in the integrated circuit device illustrated in FIGS. 1-14, 15A, and 15B.
Figure 17:
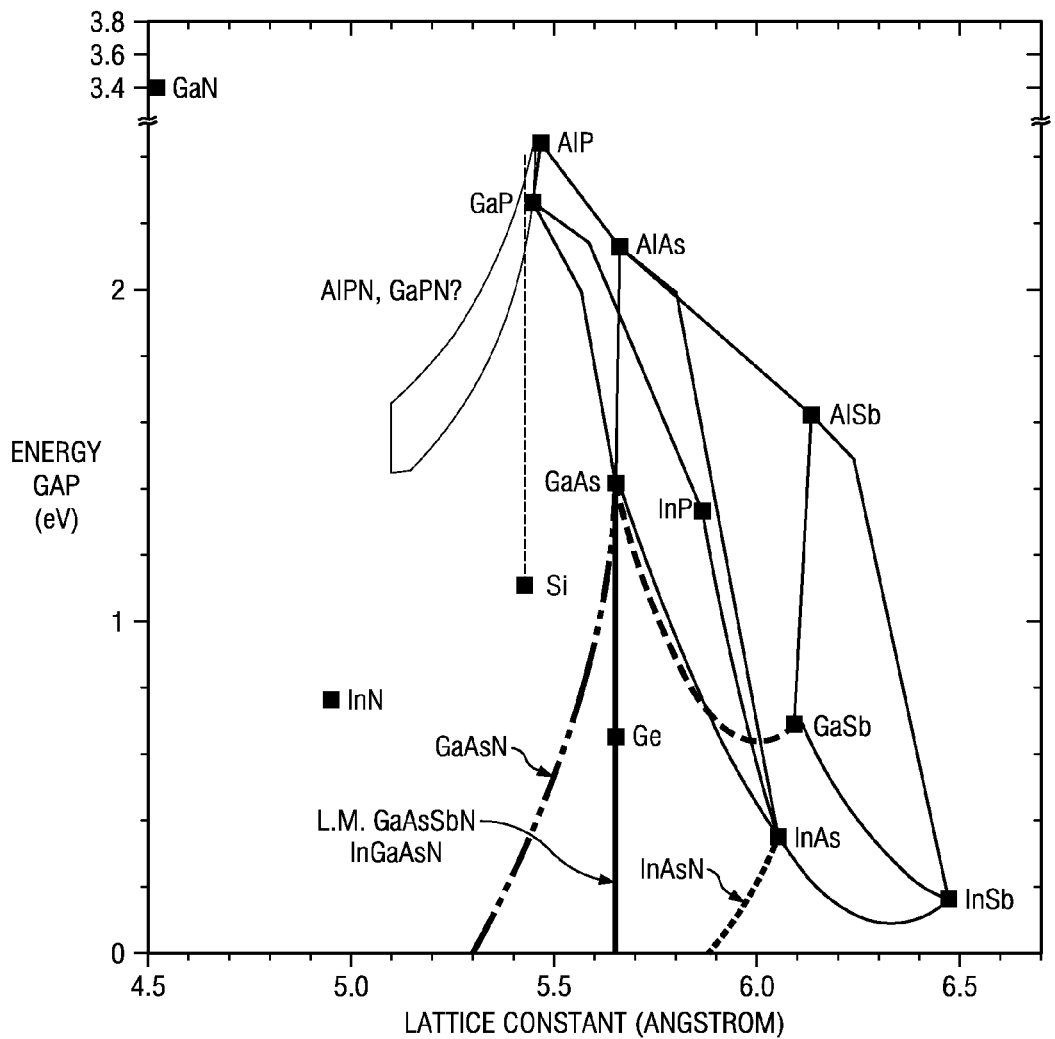

FIGS. 16 and 17 are graphs illustrating bandgap vs. lattice constant values for various ones III-V semiconductor materials discussed herein.

One embodiment is a device comprising a semiconductor substrate; a first fin structure comprising silicon or SiGe disposed over a layer of III-V semiconductor material having a high band gap energy and a lattice constant greater than that of Ge; and a second fin structure comprising silicon or SiGe disposed over a layer of III-V semiconductor material having a high band gap energy and a lattice constant smaller than that of Ge. The method further comprises a metal gate disposed over and arranged perpendicular to the first and second fin structures.

Another embodiment is a device comprising a semiconductor substrate having a substrate surface; a trench isolation structure disposed in the semiconductor substrate for isolating an NMOS region of the device and from a PMOS region of the device; and a first fin structure disposed in the NMOS region and comprising silicon or SiGe disposed over a layer of III-V semiconductor material having a high band gap energy and a lattice constant greater than that of Ge. The device further comprises a second fin structure disposed in the PMOS region and comprising silicon or SiGe disposed over a layer of III-V semiconductor material having a high band gap energy and a lattice constant smaller than that of Ge; and a gate structure disposed over and arranged perpendicular to the first and second fin structures.

Yet another embodiment is a method of fabricating a device. The method comprises providing a semiconductor substrate with a trench isolation structure for isolating an NMOS region of the device and from a PMOS region of the device; fabricating a first fin structure in the NMOS region, the first fin structure comprising silicon or SiGe disposed over a layer of III-V semiconductor material having a high band gap energy and a lattice constant greater than that of Ge; and fabricating a second fin structure in the PMOS region, the second fin structure comprising silicon or SiGe disposed over a layer of III-V semiconductor material having a high band gap energy and a lattice constant smaller than that of Ge. The method further comprises providing a gate structure disposed over and arranged perpendicular to the first and second fin structures.

The foregoing outlines features of several embodiments so that those skilled in the art may better understand the aspects of the present arsenide ("SiAs"), InGaAs, or SiGe) to provide tensile strain to enhance electron mobility, while the PMOS source/drain regions 1502 comprise a III-V semiconductor disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor substrate;
   a first fin structure comprising silicon or SiGe disposed over a layer of III-V semiconductor material having a high band gap energy and a lattice constant greater than that of Ge;
   a second fin structure comprising silicon or SiGe disposed over a layer of III-V semiconductor material, SiGe, or SiC having a high band gap energy and a lattice constant equal to or smaller than that of Ge; and
   a gate disposed over and arranged perpendicular to the first and second fin structures.

2. The device of claim 1 further comprising a shallow trench isolation ("STI") structure disposed between the fins to define an NMOS region and a PMOS region.

3. The device of claim 1 wherein the first fin is disposed in an NMOS region and the III-V semiconductor material comprising the first fin structure comprises at least one of indium phosphide ("InP"), aluminum indium arsenide ("AlInAs"), indium gallium phosphide ("InGaP"), indium gallium arsenide ("InGaAs"), gallium arsenide antimonide ("GaAsSb").

4. The device of claim 1 wherein the second fin is disposed in a PMOS region and the second fin structure comprises at least one of gallium phosphide nitride ("GaPN"), or aluminum phosphide nitride ("AlPN").

5. The device of claim 1 further comprising first source/drain ("S/D") regions disposed at opposite ends of the first fin and second S/D regions disposed at opposite ends of the second fin.

6. The device of claim 5 wherein the first S/D regions are disposed in an NMOS region and comprise a III-V semiconductor material having a relatively small lattice constant.

7. The device of claim 5 wherein the second S/D regions are disposed in a PMOS region and comprise a III-V semiconductor material having a relatively large lattice constant.

8. The device of claim 7 wherein the III-V semiconductor material comprises at least one of InAs and InP.

9. A device comprising:
   a semiconductor substrate having a substrate surface;
   a trench isolation structure disposed in the semiconductor substrate for isolating an NMOS region of the device and from a PMOS region of the device;
   a first fin structure disposed in the NMOS region and comprising silicon or SiGe disposed over a layer of III-V semiconductor material having a high band gap energy and a lattice constant greater than that of Ge;
   a second fin structure disposed in the PMOS region and comprising silicon or SiGe disposed over a layer of III-V semiconductor material, SiGe, or SiC having a high band gap energy and a lattice constant equal to or smaller than that of Ge; and
   a gate structure disposed over and arranged perpendicular to the first and second fin structures.

10. The device of claim 9 wherein the III-V semiconductor material comprising the first fin structure comprises at least one of indium phosphide ("InP"), aluminum indium arsenide ("AlInAs"), indium gallium phosphide ("InGaP"), indium gallium arsenide ("InGaAs"), gallium arsenide antimonide ("GaAsSb").

11. The device of claim 9 wherein the second fin structure comprises at least one of gallium phosphide nitride ("GaPN"), or aluminum phosphide nitride ("AlPN").

12. The device of claim 9 further comprising first source/drain ("S/D") regions disposed at opposite ends of the first fin and second S/D regions disposed at opposite ends of the second fin.

13. A device comprising:
    a silicon substrate including an NMOS region and a PMOS region;
    a first fin structure in the NMOS region and comprising a first layer of silicon extending from the silicon substrate, a second layer of III-V semiconductor material having a high band gap energy and a lattice constant greater than that of Ge, and a third layer of semiconductor material;
    a second fin structure in the PMOS region and comprising a first layer of silicon extending from the silicon substrate, a second layer of semiconductor material having a high band gap energy and a lattice constant less than that of Ge, and a third layer of semiconductor material; and
    a gate disposed over and arranged perpendicular to the first and second fin structures.

14. The device of claim 13 further comprising a shallow trench isolation ("STI") structure disposed between the NMOS region and the PMOS region.

15. The device of claim 13 wherein the second layer of III-V material in the first fin comprises at least one of InP, AlInAs, InGaP, indium gallium arsenide ("InGaAs"), or GaAsSb.

16. The device of claim 13 wherein the second layer of semiconductor material in the second fin comprises at least one of GaPN, AlPN, SiGe, or SiC.

17. The device of claim 13 wherein the third layer of semiconductor material in the first fin comprises at least one of Si, Ge, or SiGe.

18. The device of claim 13 wherein the third layer of semiconductor material in the second fin comprises at least one of Si, Ge, or SiGe.

* * * * *